United States Patent [19]
Moroshima et al.

[11] Patent Number: 4,484,206
[45] Date of Patent: Nov. 20, 1984

[54] ZENER DIODE WITH PROTECTIVE PN JUNCTION PORTIONS

[75] Inventors: Heiji Moroshima; Hajime Terakado; Hideharu Fujii, all of Yamanashi, Japan

[73] Assignee: Hitachi, Ltd., Tokyo, Japan

[21] Appl. No.: 352,764

[22] Filed: Feb. 26, 1982

Related U.S. Application Data

[63] Continuation of Ser. No. 029,055, Apr. 11, 1979, abandoned.

[30] Foreign Application Priority Data

Mar. 30, 1978 [JP] Japan ................... 53-36886
Apr. 21, 1978 [JP] Japan ................... 53-46547

[51] Int. Cl.³ .......................................... H01L 29/90
[52] U.S. Cl. .................................... 357/13; 357/20; 357/51; 357/89; 357/90; 307/318
[58] Field of Search ................. 357/13, 20, 89, 90, 357/51; 307/318

[56] References Cited

U.S. PATENT DOCUMENTS

| | | | |
|---|---|---|---|
| 3,281,656 | 10/1966 | Noble | 357/13 |
| 3,345,221 | 10/1967 | Lesk | 357/13 |
| 3,349,298 | 10/1967 | Shockley et al. | 357/13 |
| 3,497,776 | 2/1970 | Philips | 357/13 |
| 3,534,232 | 10/1970 | Weinerth | 357/13 |
| 3,544,397 | 12/1970 | Weinerth | 357/13 |
| 3,612,959 | 10/1971 | Simon | 357/13 |
| 3,649,890 | 3/1972 | Howell et al. | 357/15 |
| 3,662,233 | 5/1972 | Clerc et al. | 357/13 |
| 3,968,472 | 7/1976 | Taylor | 307/318 |
| 4,025,802 | 5/1977 | Inoue et al. | 357/13 |
| 4,110,775 | 8/1978 | Festa | 307/318 |

FOREIGN PATENT DOCUMENTS

| | | |
|---|---|---|
| 1944924 | 3/1971 | Fed. Rep. of Germany . |
| 2207654 | 2/1974 | Fed. Rep. of Germany . |

Primary Examiner—William D. Larkins
Assistant Examiner—Charles S. Small, Jr.
Attorney, Agent, or Firm—Antonelli, Terry & Wands

[57] ABSTRACT

A first rectifying contact portion of a semiconductor device such as a Zener diode has a small area in order to attain a hard breakdown characteristic and a low noise characteristic. When a predetermined current which is not greater than the maximum allowable instantaneous value of non-D.C. currents flows through the first rectifying contact portion, a second rectifying contact portion which has a large area starts breakdown due to a voltage drop across a resistance component connected in series with the first rectifying contact portion and a breakdown voltage of the first rectifying contact portion.

Owing to the fact that current is dispersed to the first rectifying contact portion and the second rectifying contact portion, a semiconductor device such as a Zener diode exhibiting a high endurance characteristic against surge voltages can be provided.

6 Claims, 13 Drawing Figures

ZENER DIODE WITH PROTECTIVE PN JUNCTION PORTIONS

This is a continuation of application Ser. No. 029,055 filed Apr. 11, 1979, now abandoned.

BACKGROUND OF THE INVENTION

This invention relates to a semiconductor device such as, for example, a Zener diode.

In a Zener diode which is utilized as a voltage regulator device, the breakdown voltage of a PN-junction is exploited as a constant voltage. The breakdown voltage of the PN-junction varies depending upon an impurity density deviation, crystal defects, etc. Accordingly, when the junction area of the PN-junction is large, the breakdown voltages of individual minute junction parts within the junction area are different due to the presence of impurity density deviations or crystal defects in the respective minute junction parts, and the Zener diode exhibits a soft breakdown characteristic.

On the other hand, the Zener (tunneling) phenomenon predominates in a Zener diode whose breakdown voltage is below 5 V, whereas the avalanche breakdown phenomenon predominates in a Zener diode whose breakdown voltage is above 5 V. Whichever phenomenon may be predominant, the Zener diode exhibits the soft breakdown characteristic when it utilizes a large PN-junction area. Simultaneously, noise is generated by the minute breakdowns at the minute junction points, so that the noise characteristic becomes inferior.

Thus, in order to obtain a Zener diode having a hard breakdown characteristic and a low noise characteristic, it is desirable to make the junction area of the PN-junction small.

Further, when the current density of D.C. current which flows through the PN-junction upon the breakdown of the PN-junction becomes excessive, the junction temperature of the PN-junction rises and the thermal carrier creation of electrons and holes acts as positive feedback, so that the current density increases more. On account of the excessive increase of the current density of D.C. current, current crowding occurs on one place of the PN-junction to give rise to the thermal breakdown or secondary breakdown of the PN-junction, and the current crowding place of the PN-junction is permanently destroyed.

The inventors' study has revealed that the permanent destruction of the PN-junction due to the thermal breakdown or the secondary breakdown occurs even when a non-D.C. current at an excess current density flows through the PN-junction for a comparatively short time. The PN-junction of the Zener diode accordingly undergoes the permanent destruction due to a non-D.C. voltage such as surge voltage of an impulse nature from the human body of a circuit assembling worker, etc. or an A.C. voltage leaking from a soldering iron such as is applied when the Zener diode is packaged on a circuit board, or when an abnormal surge voltage is applied to a finished circuit after the Zener diode has been packaged on the circuit board.

According to the inventors' research, it has been experimentally revealed that the critical current density at which the permanent destruction of the PN-junction of the Zener diode occurs varies depending upon the device structure and dimensions of the Zener diode, the heat radiating structure of a case or envelope, and the pulse width of an impulsive surge voltage or the frequency of a leakage A.C. voltage and that the critical current density has a value of approximately $16 \times 10^6$ (mA/cm$^2$) when the voltage applied to the Zener diode is an A.C. voltage. According to the inventors' study, it has been revealed that the point of the destruction attributed to the application of such abnormal voltage of an impulse nature or an A.C. voltage nature lies outside the characteristic curve of the maximum allowable power dissipation $P_{dmax}$ during the D.C. operation of the Zener diode.

To the end of intensifying the characteristic of endurance against the permanent destruction of the PN-junction ascribable to the application of the abnormal voltage of an impulse nature or an A.C. voltage nature, it has been considered to lower the current density by enlarging the junction area of the PN-junction.

However, with the large junction area of the PN-junction, the Zener diode exhibits the soft breakdown characteristic and the inferior noise characteristic even though the endurance characteristic against the permanent destruction is enhanced.

SUMMARY OF THE INVENTION

It is accordingly an object of this invention to provide a semiconductor device such as a Zener diode which has a hard breakdown characteristic, a low noise characteristic and a high endurance characteristic against the permanent destruction of a rectifying contact portion.

The fundamental construction of this invention for accomplishing the object is characterized in that a resistance component is connected in series with a first rectifying contact portion of the semiconductor device, that a second rectifying contact portion having a breakdown characteristic is further connected in parallel with the series connection consisting of the first rectifying contact portion and the resistance component, and that a resistance value of the resistance component and a voltage value of a breakdown voltage of the second rectifying contact portion are set so that the second rectifying contact portion may breakdown due to a breakdown voltage of the first rectifying contact portion and a voltage drop across the resistance component in the case where a predetermined current which is not greater than an allowable current value of the first rectifying contact portion flows through the first rectifying contact portion.

DESCRIPTION OF THE PREFERRED EMBODIMENTS

Hereunder, embodiments of this invention will be concretely described with reference to the drawings.

Figure 1:
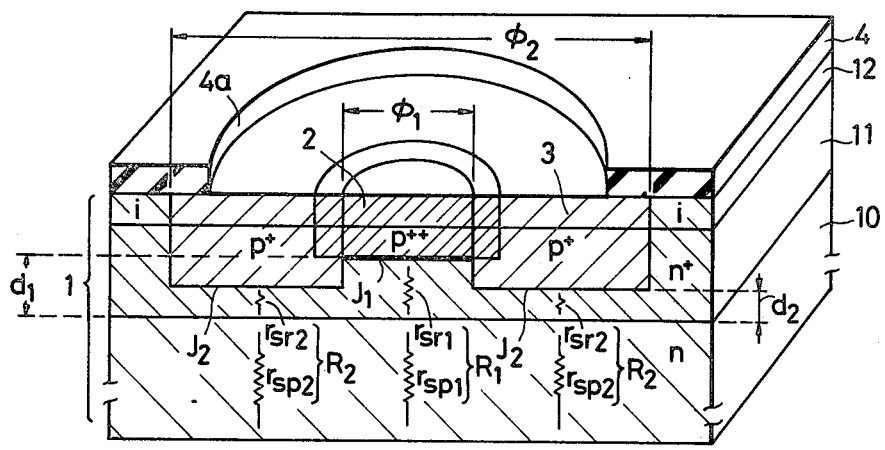
FIG. 1 shows a perspective sectional view of a Zener diode according to an embodiment of this invention.

FIG. 1 shows a perspective sectional view of a Zener diode according to an embodiment of this invention. A silicon chip 1 is made up of an n-type silicon substrate 10 which is 150 μm thick and which is doped at a comparatively low impurity density ($5 \times 10^{16}$ atoms/cm$^3$) into a resistivity of 0.15Ω·cm, an n+-type silicon epitaxial layer 11 which is 10 μm thick and which is doped at a comparatively high impurity density ($7 \times 10^{\sim}$ atoms/cm$^3$) into a resistivity of 0.008Ω·cm, and an intrinsic silicon epitaxial layer 12 which is 1.5 μm thick and which is doped with no impurity.

In order to define a PN-junction as a first rectifying contact portion $J_1$, a p++-type highly doped central region 2 is formed at a very high impurity density ($5 \times 10^{19}$ atoms/cm$^3$) by the selective impurity diffusion at a depth of 1.8 μm from the surface of the silicon chip 1.

In order to define a PN-junction as a second rectifying contact portion $J_2$, a P+-type guard ring region 3 is formed at a high impurity density ($10^{19}$ atoms/cm$^3$) by the selective impurity diffusion at a depth of 3.0 μm from the surface of the silicon chip 1.

On the front surface of the silicon chip 1, a surface passivation film 4 made of a silicon oxide film is formed. The surface passivation film 4 is formed with an opening 4a so as to expose the front surfaces of the P++-type highly doped central region 2 and the p+-type guard ring region 3. Although not shown in the figure, a first electrode $T_1$ which lies on ohmic contact with the central region 2 and the guard ring region 3 is formed in the opening 4a, and a second electrode $T_2$ which lies in ohmic contact with the n-type silicon substrate 10 is formed on the rear surface of this n-type silicon substrate.

The first rectifying contact portion $J_1$ breaks down owing to the Zener (tunneling) phenomenon or the avalanche phenomenon in the normal D.C. operation of the Zener diode, and the breakdown voltage is utilized as the Zener voltage. The voltage value of the breakdown voltage $V_{Z1}$ in the PN-junction of the first rectifying contact portion $J_1$ can be determined by the impurity densities of the p++-type highly doped central region 2 and the n+-type silicon epitaxial layer 11. In the present embodiment, the breakdown voltage $V_{Z1}$ of the PN-junction of the first rectifying contact portion $J_1$ is set at 7 V.

In order to obtain a hard breakdown characteristic and a low noise characteristic in the PN-junction of the first rectifying contact portion $J_1$ which generates the Zener voltage of the Zener diode, the area of the first rectifying contact portion $J_1$ is made a small value. To this end, the diameter $\phi_1$ of the first rectifying contact portion $J_1$ is made as small a value as 40 μm. Accordingly, the area $A_1$ becomes as small as $1.256 \times 10^{-5}$ (cm$^2$).

Consequently, when a bias current in a range of 0.5–50 mA flows in the normal operation of the Zener diode, a current density in the first rectifying contact portion $J_1$ falls within a range of $0.398$–$3.98 \times 10^5$ (mA/cm$^2$). Therefore, the low noise characteristic can be attained.

On the other hand, when the current density through the first rectifying contact portion $J_1$ becomes excessive on account of an abnormal voltage of an impulse or a sinusoidal A.C. signal which is applied to the Zener diode, there is the danger that the PN-junction of the first rectifying contact portion $J_1$ will be permanently destroyed.

Figure 2A:
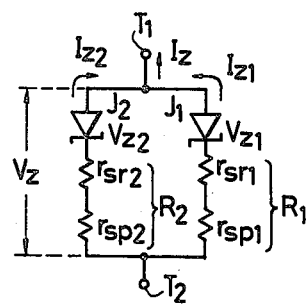
FIGS. 2(A) and 2(B) show an equivalent circuit diagram and the terminal voltage ($V_Z$)—Zener current ($I_Z$) characteristic of the Zener diode shown in FIG. 1, respectively.
Figure 2B:
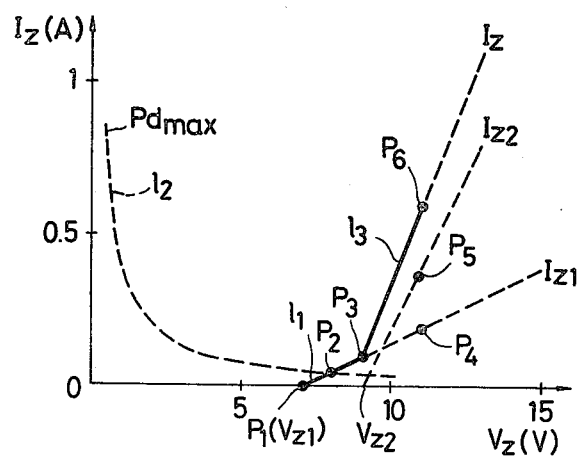

FIG. 2(B) illustrates the voltage-current characteristic of the Zener diode according to the present embodiment. Since the first rectifying contact portion $J_1$ has a breakdown voltage $V_{Z1}$ of the 7 volts, the axis of abscissas representative of the voltage and the voltage-current characteristic curve of the Zener diode intersect at a point $P_1$. When the value of current flowing through the first rectifying contact portion $J_1$ increases, a voltage drop across a series resistance component within the silicon chip increases, so that the terminal voltage of the Zener diode increases.

A series resistance $r_{sr1}$ in the n+-type silicon epitaxial layer 11 associated with the first rectifying contact portion $J_1$ is calculated by the following equation:

$$r_{sr1} = \rho_{11} \times \frac{d_1}{A_1} = 0.008\Omega \cdot cm \times \frac{9.7 \times 10^{-4} cm}{3.14 \times (20 \times 10^{-4} cm)^2} \quad (1)$$

$$= \frac{0.0776}{1256} \times 10^4 \Omega = 0.617\Omega$$

$\rho^{11}$: resistivity of the n+-type silicon epitaxial layer,
$d_1$: distance from the first rectifying contact portion $J_1$ to the n-type silicon substrate 10,
$A_1$: area of the first rectifying contact portion $J_1$.

On the other hand, a spreading resistance $r_{sp1}$ in the n-type silicon substrate 10 associated with the first rectifying contact portion $J_1$ is calculated by the following equation:

$$r_{sp1} = \frac{\rho 10}{2 \phi_1} = \frac{0.15\Omega \cdot cm}{2 \times 40 \times 10^{-4} cm} \quad (2)$$

$$= \frac{0.15}{80} \times 10^4 \Omega = 18.75\Omega$$

Accordingly, a series resistance $R_1$ associated with the first rectifying contact portion $J_1$ is calculated by the following equation:

$$R_1 = r_{sr1} + r_{sp1} = 0.617\Omega + 18.75\Omega = 20\Omega \quad (3)$$

Accordingly, when the current flowing through the first rectifying contact portion $J_1$ increases, the terminal voltage $V_Z$ of the Zener diode varies as shown by a straight line $l_1$ in FIG. 2(B) due to the breakdown voltage of the first rectifying contact portion $J_1$ and the voltage drop across the series resistance $R_1$.

On the other hand, the D.C. power dissipation $P_d$ increases due to the increase of the D.C. current flowing through the Zener diode. When, as a result, the quantity of heat generation exceeds the quantity of heat radiation from a case or envelope, the PN-junction of the Zener diode is thermally destroyed. Therefore, as indicated by the following equation, the D.C. power dissipation $P_d$ must be a value smaller than the maximum allowable D.C. power dissipation $P_{dmax}$ which is determined by the maximum allowable temperature $T_{jmax}$ of the PN-junction, the ambient temperature $T_a$ of the case and the thermal resistance $\theta_{jc}$ between the PN-junction and the case:

$$P_d \leq P_{dmax} = \frac{T_{jmax} - T_a}{\theta_{jc}} \qquad (4)$$

Since the maximum allowable D.C. power dissipation $P_{dmax}$ of the Zener diode according to the embodiment of this invention is approximately 400 mW, the power dissipation curve is indicated as a broken line $l_2$ in FIG. 2(B).

When the D.C. current flowing through the Zener diode has increased to an operating point $P_2$ at which the straight line $l_1$ intersects with the curve $l_2$ corresponding to the maximum allowable D.C. power dissipation $P_{dmax}$, the D.C. power dissipation $P_d$ of the Zener diode reaches the maximum allowable D.C. power dissipation $P_{dmax}$, and the junction temperature $T_j$ of the PN-junction of the first rectifying contact portion $J_1$ reaches the maximum junction temperature $T_{jmax}$. Accordingly, there is a high danger that the PN-junction of the first rectifying contact portion $J_1$ will thermally undergo permanent destruction at the operating point $P_2$.

The design of a circuit in which the Zener diode is to be assembled must therefore be made so that a D.C. bias current of a value smaller than the D.C. current at the operating point $P_2$ may flow through the Zener diode in the normal circuit operation.

On the other hand, in a case where a non-D.C. current which is attributed to the application of an abnormal voltage of an impulse signal or an A.C. voltage signal flows through the Zener diode, the PN-junction undergoes permanent destruction with the boundary at a critical value of a parameter which is different from the maximum allowable D.C. power dissipation $P_{dmax}$ in the case where the D.C. current flows through the Zener diode. The power consumption of the Zener diode at the application of the non-D.C. current is calculated from the effective value of the product between the non-D.C. current and the PN-junction voltage. Thus, the maximum allowable instantaneous value $I_{F\ NON\text{-}DC(max)}$ of non-D.C. currents in a range in which the PN-junction of the Zener diode does not undergo the permanent destruction when the non-D.C. current flows through the Zener diode becomes a value greater than the maximum allowable D.C. current value $I_{F\ DC(max)}$ corresponding to the maximum allowable D.C. power dissipation $P_{dmax}$ although it differs depending upon the pulse width of the abnormal voltage of impulse nature or the frequency of the abnormal voltage of A.C. voltage nature. In a case where the non-D.C. current is the current of an impulse nature, it is free from periodical recurrence as in the current of sinusoidal A.C. nature. Therefore, the maximum allowable instantaneous value $I_{F\ IMP(max)}$ of the non-D.C. current in the case where an abnormal impulse current flows through the Zener diode becomes a value which is greater than the maximum allowable instantaneous value $I_{F\ AC(max)}$ of the non-D.C. current in the case where a sinusoidal A.C. current flows through the Zener diode.

The inventors have experimentally revealed that the permanent destruction of the PN-junction ascribable to such application of the non-D.C. current to the Zener diode occurs with the boundary at the value of the critical allowable current density $J_{crit}$ which is obtained by dividing the maximum allowable instantaneous value $I_{F\ NON\text{-}DC(max)}$ ($I_{F\ AC(max)}$, $I_{F\ IMP(max)}$) of the non-D.C. current by the junction area of the PN-junction (the critical allowable current density $J_{crit}$ has a value of approximately $16 \times 10^6$ (mA/cm$^2$) though it differs depending upon the device structure of the Zener diode, the heat radiating structure of the case, etc.).

Accordingly, a second rectifying contact portion $J_2$ is especially disposed in the Zener diode embodying this invention as shown in FIG. 1. Thus, the resistance value of the series resistance $R_1$ and the voltage value of the breakdown voltage $V_{Z2}$ of the second rectifying contact portion $J_2$ are set so that when the current flowing through the first rectifying contact portion $J_1$ has increased to a predetermined current value $I_{ON}$ on account of the application of an abnormal voltage of impulse nature or sinusoidal nature to the Zener diode, the PN-junction of the second rectifying contact portion $J_2$ may breakdown due to the voltage drop across the series resistance $R_1$ ($=r_{sr1}+r_{sp1}$) equivalently connected in series with the first rectifying contact portion $J_1$ and the breakdown voltage $V_{Z1}$ of the first rectifying contact portion $J_1$. Further, the predetermined current value $I_{ON}$ is set at a magnitude smaller than the maximum allowable instantaneous value $I_{F\ NON\text{-}DC(max)}$ of the non-D.C. current in the PN-junction of the first rectifying contact portion $J_1$.

As already explained, the PN-junction of the second rectifying contact portion $J_2$ is formed between the $p^+$-type guard ring region 3 and the $n^+$-type silicon epitaxial layer 11. The value of the breakdown voltage $V_{Z1}$ of the PN-junction of the second rectifying contact portion $J_2$ can be determined by the impurity densities of the $p^+$-type guard ring region 3 and the $n^+$-type silicon epitaxial layer 11. In the present embodiment, the value of the breakdown voltage $V_{Z2}$ is set at 9 V which is greater than the value (7 V) of the breakdown voltage $V_{Z1}$ of the first rectifying contact portion $J_1$.

To the end of preventing the PN-junctions of the first rectifying contact portion $J_1$ and the second rectifying contact portion $J_2$ from being easily destroyed even when a great non-D.C. current flows through the Zener diode, and to the end of making small a series resistance $R_2$ associated with the second rectifying contact portion $J_2$, it is desirable that the area of the second rectifying contact portion $J_2$ is large. Accordingly, the diameter $\phi_2$ of the second rectifying contact portion $J_2$ is made as large a value as 150 μm. The area $A_2$ of the second rectifying contact portion $J_2$ becomes approximately $17.6 \times 10^{-5}$ (cm$^2$), which is over ten times greater than the area $A_1$ of the first rectifying contact portion $J_1$.

Accordingly, a series resistance $r_{sr2}$ in the $n^+$-type silicon epitaxial layer 11 associated with the second rectifying contact portion $J_2$ is calculated in approximation by the following equation where $d_2$ denotes the distance from the second rectifying contact portion $J_2$ to the n-type silicon substrate 10:

$$r_{sr2} = \rho_{11} \frac{d_2}{A_2} = 0.008 \Omega \cdot \text{cm} \frac{7 \times 10^{-4} \text{cm}}{3.14 \times (75 \times 10^{-4} \text{cm})^2} \qquad (5)$$

$$= \frac{0.056}{17662.5} \times 10^4 \Omega = 0.03\Omega$$

Further, a spreading resistance $r_{sp2}$ in the n-type silicon substrate 10 associated with the second rectifying contact portion $J_2$ is calculated in approximation by the following equation:

$$r_{sp2} = \frac{\rho 10}{2\phi_2} = \frac{0.15\Omega \cdot cm}{2 \times 150 \times 10^{-4} cm} \quad (6)$$

$$= 0.0005 \times 10^4 \Omega = 5\Omega$$

Thus, as calculated from the following equation, the series resistance $R_2$ associated with the second rectifying contact portion $J_2$ becomes smaller than the value of the series resistance $R_1$ associated with the first rectifying contact portion $J_1$:

$$R_2 = r_{sr2} + r_{sp2} = 0.03\Omega + 5\Omega \approx 5\Omega \quad (7)$$

Therefore, the equivalent circuit of the Zener diode of the present embodiment shown in FIG. 1 can be illustrated by a circuit diagram of FIG. 2(A).

Referring to FIG. 2(A), a current $I_{Z1}$ flowing through the first rectifying contact portion $J_1$ and a current $I_{Z2}$ flowing through the second rectifying contact portion $J_2$ are given by the following equations in relation to the characteristic of the Zener current ($I_Z$) versus the terminal voltage ($V_Z$) between the first electrode $T_1$ and second electrode $T_2$ of the Zener diode:

$$V_Z = V_{Z1} + R_1 \cdot I_{Z1} = V_{Z2} + R_2 \cdot I_{Z2} \quad (8)$$

$$I_Z = I_{Z1} + I_{Z2} \quad (9)$$

In a case where the terminal voltage $V_Z$ is greater than the breakdown voltage $V_{Z1}$ of the first rectifying contact portion $J_1$ and is smaller than the breakdown voltage $V_{Z2}$ of the second rectifying contact portion $J_2$, only the PN-junction of the first rectifying contact portion $J_1$ breaksdown. Consequently, the Zener current $I_Z$ becomes equal to the current $I_{Z1}$ flowing through the first rectifying contact portion $J_1$, and the terminal voltage ($V_Z$)—Zener current ($I_Z$) characteristic can be represented by the straight line $l_1$ between the operating points $P_1$ and $P_3$ in FIG. 2(B). At the operating point $P_3$, the terminal voltage $V_Z$ becomes equal to the breakdown voltage $V_{Z2}$ of the second rectifying contact portion $J_2$.

In a case where the terminal voltage $V_Z$ is greater than the breakdown voltage $V_{Z2}$ of the second rectifying contact portion $J_2$, the PN-junction of the first rectifying contact portion $J_1$ and the PN-junction of the second rectifying contact portion $J_2$ breakdown simultaneously. Consequently, the Zener current $I_Z$ becomes equal to the sum between the current $I_{Z1}$ flowing through the first rectifying contact portion $J_1$ and the current $I_{Z2}$ flowing through the second rectifying contact portion $J_2$, and the terminal voltage ($V_Z$)—Zener current ($I_Z$) characteristic can be represented by a straight line $l_3$ extending from the operating point $P_3$ in FIG. 2(B).

Figure 4:
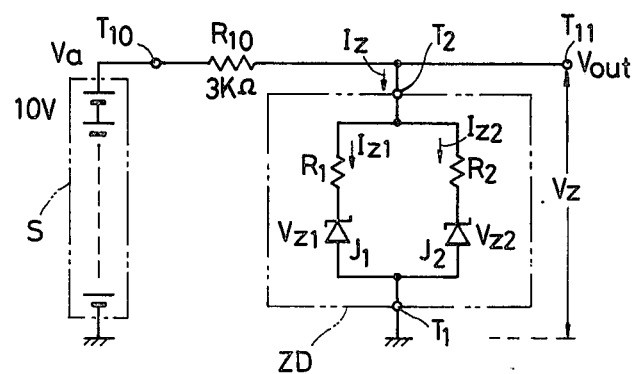
FIG. 4 shows a voltage regulator circuit in which the Zener diode of FIG. 1 is utilized.

A case will now be considered where the Zener diode of the present embodiment is utilized in a voltage regulator circuit as shown by way of example in FIG. 4. By connecting a resistance $R_{10}$ between a power supply S and a Zener diode ZD, a constant output voltage $V_{OUT}$ which is substantially equal to the breakdown voltage $V_{Z1}$ (7 V) of the PN-junction of the first rectifying contact portion $J_1$ is provided at an output terminal $T_{11}$ of the voltage regulator circuit in spite of small changes in a voltage $V_a$ of the power supply S. When, in a case where the voltage $V_a$ of the power supply S is about 10 V, the value of the Zener current $I_Z(I_{Z1})$ is made 1 mA in order to operate the Zener diode with a low noise characteristic, the resistance value of the resistor $R_{10}$ is designed from the following equation:

$$R_{10} = \frac{V_a - V_{Z1}}{I_{Z1}} = \frac{10 - 7 (V)}{1 (mA)} = 3K\Omega \quad (10)$$

The D.C. power dissipation $P_d$ of the Zener diode ZD during the normal operation of the voltage regulator circuit is calculated from the following equation, and is designed at a value sufficiently smaller than the maximum allowable D.C. power dissipation $P_{dmax}$ of 400 mW.

$$P_d = V_{Z1} \cdot I_{Z1} + R_1 \cdot I_Z^2 \approx 7(V) \cdot 1 \, (mA) + 20(\Omega) \cdot (mA)^2 \quad (11)$$

$$\approx 7mW$$

On the other hand, in a case where only the first rectifying contact portion $J_1$ is disposed and where the second rectifying contact portion $J_2$ is not disposed, the non-D.C. current $I_{Z1}$ having an instantaneous value of about 200 mA flows through the resistor $R_{10}$ and the first rectifying contact portion $J_1$ of the Zener diode when an abnormal voltage of impulse nature or sinusoidal nature having an instantaneous value of about 600 V is applied to an input terminal $T_{10}$ of the voltage regulator circuit. In this case, a current density $J_{VZ1}$ in the first rectifying contact portion $J_1$ becomes equal to the critical allowable current density $J_{crit}$ already explained as calculated from the following equation, so that the PN-junction of the first rectifying contact portion $J_1$ has the danger of being permanently destroyed at an operating point $P_4$ in FIG. 2(B).

$$J_{VZ1} = \frac{I_{Z1}}{A_1} = \frac{200 \, (mA)}{1.256 \times 10^{-5} \, (cm^2)} = 1.59 \times 10^5 \, (mA/cm^2)$$

$$\approx 16 \times 10^6 \, (mA/cm^2)$$

In contrast, both the first rectifying contact portion $J_1$ and the second rectifying contact portion $J_2$ are disposed in this invention. Therefore, when the Zener current $I_{Z1}$ having the instantaneous value of 200 mA flows through the first rectifying contact portion $J_1$, the terminal voltage $V_Z$ is calculated as below by the use of Equation (8):

$$V_Z = V_{Z1} + R_1 \cdot I_{Z1}$$

$$= 7 + 20 \times 0.2$$

$$= 11 \, V$$

When the terminal voltage $V_Z$ is 11 V, the Zener current $I_{Z2}$ flowing through the second rectifying contact portion $J_2$ is calculated as below by also using Equation (8):

$$I_{Z2} = \frac{V_Z - V_{Z2}}{R_2} = \frac{11 - 9 \text{ (V)}}{5 \text{ (}\Omega\text{)}} = 400 \text{ (mA)}$$

Thus, as apparent from Equation (9), the Zener current $I_Z$ of a value of the sum between the Zener current $I_{Z1}$ flowing through the first rectifying contact portion $J_1$ and the Zener current $I_{Z2}$ flowing through the second rectifying contact portion $J_2$, that is, the Zener current $I_Z$ of 600 mA flows between the first electrode $T_1$ and the second electrode $T_2$. With the Zener diode according to the present embodiment, therefore, the PN-junction of the first rectifying contact portion $J_1$ is permanently destroyed for the first time when an abnormal voltage of impulse nature or sinusoidal nature having an instantaneous value of at least about 1,800 V is applied to the input terminal $T_{10}$.

As is apparent from the above description, by disposing the second rectifying contact portion $J_2$ in accordance with the present embodiment, the maximum allowable instantaneous value $I_{F\ NON\text{-}DC(max)}$ of non-D.C. currents can be increased from 200 mA to 600 mA, and a high endurance characteristic can be brought forth against the permanent destruction of the rectifying contact portion ascribable to the application of the abnormal voltage of non-D.C. nature.

On the other hand, according to the present embodiment, the operating point at which the PN-junction of the second rectifying contact portion $J_2$ having the large area starts the breakdown lies outside the curve $l_2$ of the maximum allowable D.C. power dissipation $P_{dmax}$. Therefore, at the operating point ($P_1$-$P_2$) at which the D.C. power dissipation $P_d$ of the Zener diode is not greater than the maximum allowable D.C. power dissipation $P_{dmax}$ and at which the normal circuit operation is effected, only the first rectifying contact portion $J_1$ of the small area breaks down, so that the hard breakdown characteristic and the low noise characteristic can be attained. It is accordingly desirable to make the breakdown voltage $V_{Z2}$ of the second rectifying contact portion $J_2$ a value which is greater than the terminal voltage $V_Z$ at the operating point $P_2$.

The series resistance $R_1$ associated with the first rectifying contact portion $J_1$ has its resistance value determined so as to fulfill the following equation in order that the second rectifying contact portion $J_2$ may break down due to the voltage drop across the series resistance $R_1$ and the breakdown voltage $V_{Z1}$ of the first rectifying contact portion $J_1$ when a predetermined current $I_{Z(P3)}$ which has a current density in a range greater than the maximum allowable current density of D.C. currents at the operating point $P_2$ and smaller than the critical allowable current density $J_{crit}$ of non-D.C. currents flows through the first rectifying contact portion $J_1$:

$$V_{Z1} + R_1 \cdot I_{Z(P3)} > V_{Z2} \quad (12)$$

Figure 3:
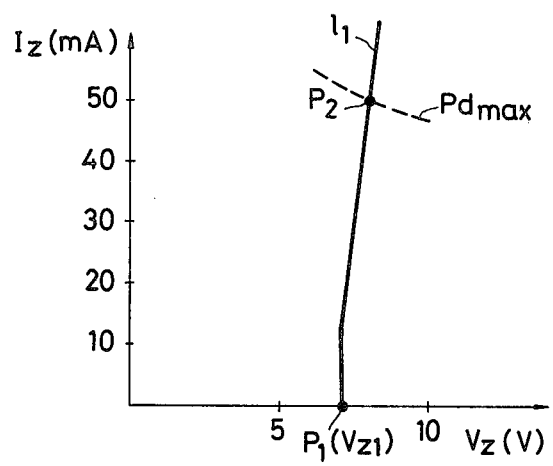
FIG. 3 shows the terminal voltage ($V_Z$)—Zener current ($I_Z$) characteristic at power dissipations not greater than the maximum allowable D.C. power dissipation $P_{dmax}$, of the Zener diode shown in FIG. 1.

However, when the resistance value of the series resistance $R_1$ is too great, an operating resistance $r_d$ in the operating range ($P_1$-$P_2$) in which the D.C. power dissipation $P_d$ is not greater than the maximum allowable D.C. power dissipation $P_{dmax}$ becomes high, and the constant-voltage characteristic becomes inferior. Since, in the present embodiment, the series resistance $R_1$ associated with the first rectifying contact portion $J_1$ has the small value of about 20$\Omega$, an excellent constant-voltage characteristic can be bestowed as shown on enlarged scale in FIG. 3 at the operating point ($P_1$-$P_2$) at which the D.C. power dissipation $P_d$ is not greater than the maximum allowable D.C. power dissipation $P_{dmax}$.

On the other hand, to the end of increasing the maximum allowable instantaneous value $I_{F\ NON\text{-}DC(max)}$ of non-D.C. currents, it is desirable that the resistance value of the series resistance $R_2$ associated with the second rectifying contact portion $J_2$ is made the smallest possible value.

In the present embodiment, the intrinsic silicon epitaxial layer 12 is specifically disposed in order to prevent the P-type surface impurity densities of the $p^{++}$-type central region 2 and the $p^+$-type guard ring region 3 from lowering in such a manner that the p-type impurity of these regions 2 and 3 is compensated for at the surface of the silicon chip 1 by the n-type impurity of the $n^+$-type silicon epitaxial layer 11. When the p-type surface impurity densities of the regions 2 and 3 lower too much, it becomes impossible to attain the ohmic contact with the first electrode $T_1$.

This invention is not restricted to the foregoing embodiment, but it can adopt various modified aspects of performance.

By way of example, the voltage value of the breakdown voltage $V_{Z1}$ in the PN-junction of the first rectifying contact portion $J_1$ can be varied by the impurity densities of the $p^{++}$-type highly doped central region 2 and the $n^+$-type silicon epitaxial layer 11. Particularly by varying the impurity density of the $n^+$-type silicon epitaxial layer 11 in a range of from 8/1,000 to 100/1,000, the breakdown voltage $V_{Z1}$ of the first rectifying contact portion $J_1$ can be varied in a range of from 5.2 V to 38 V. Simultaneously therewith, the breakdown voltage of the second rectifying contact portion $J_2$ can be similarly varied.

Figure 5:
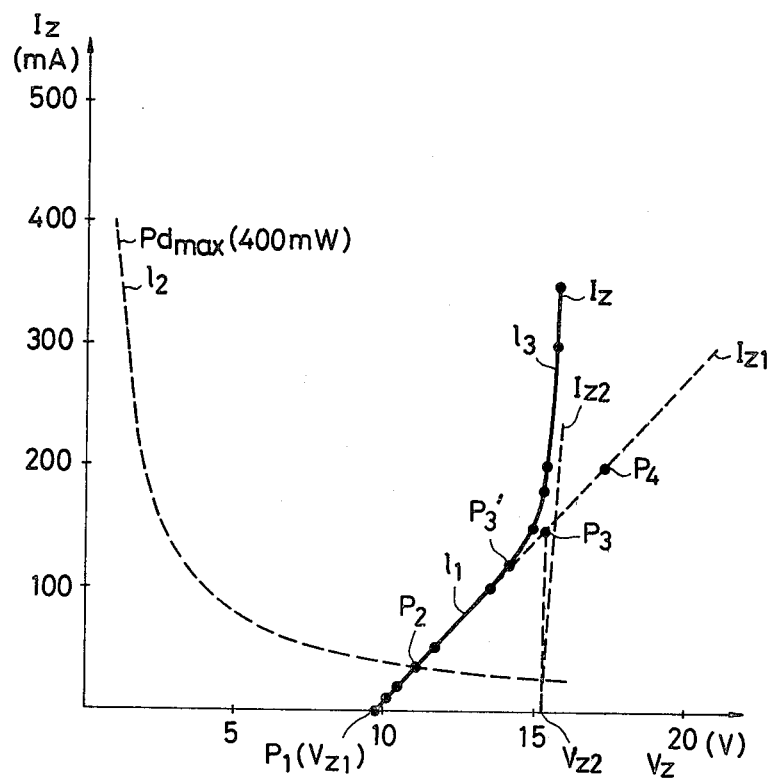
FIG. 5 shows the terminal voltage ($V_Z$)—Zener current ($I_Z$) characteristic of a Zener diode which has been manufactured by way of experiments done in accordance with this invention.

FIG. 5 shows the terminal voltage ($V_Z$)—Zener current ($I_Z$) characteristic of a Zener diode which has been manufactured by way of trial by varying the impurity density of the $n^+$-type silicon epitaxial layer 11. The breakdown voltage $V_{Z1}$ of the first rectifying contact portion $J_1$ has a voltage value of about 9.8 V, while the portion $J_2$ has a voltage value of about 15.3 V. The Zener current $I_Z$ becomes greater than the current $I_{Z1}$ flowing through the first rectifying contact portion $J_1$, from an operating point $P_3'$ at the terminal voltage $V_Z$ below the operating $P_3$ corresponding to the breakdown voltage $V_{Z2}$.

Figure 6:
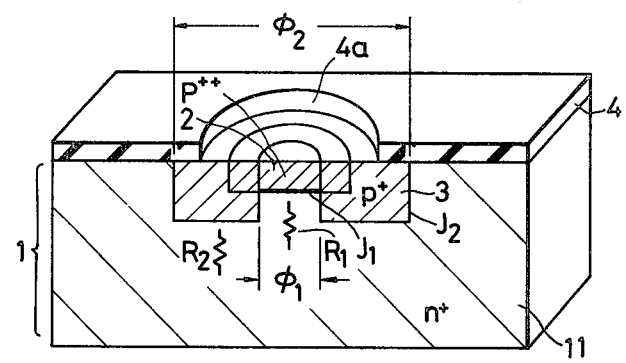
FIGS. 6, 7 and 8 show sectional views of Zener diodes according to modified embodiments of this invention, respectively.

FIG. 6 shows a Zener diode according to a modified embodiment of this invention. Numeral 11 designates an $n^+$-type silicon layer, and numeral 2 a $p^{++}$-type central region which defines a first rectifying contact portion $J_1$ along with the layer 11 and in which an impurity is diffused at a density of about $5 \times 10$ atoms/cm$^3$. Shown at 3 is a $p^+$-type diffused guard ring region which overlaps the peripheral part of the $p^{++}$-type central region 2 and which surrounds it entirely. This guard ring region 3 has an impurity density which is slightly lower than that of the region 2 and is, for example, about 10 atoms/cm$^3$, and it defines a second rectifying contact portion $J_2$ between it and the layer 11. Numeral 4 indicates a surface passivation film which is formed on the front surface of the layer 1 and which is made of a silicon oxide film. It has an opening 4a which exposes the front surface of the $p^{++}$-type central region including part of the $p^+$-type guard ring region, and in which a first electrode $T_1$ in ohmic contact is formed though not shown. The diameter $\phi_1$ of the first rectifying contact portion $J_1$ is made e.g. 40 μm, while the diameter $\phi_2$ of the second rectifying contact portion $J_2$ is made e.g. 200 μm.

Figure 7:
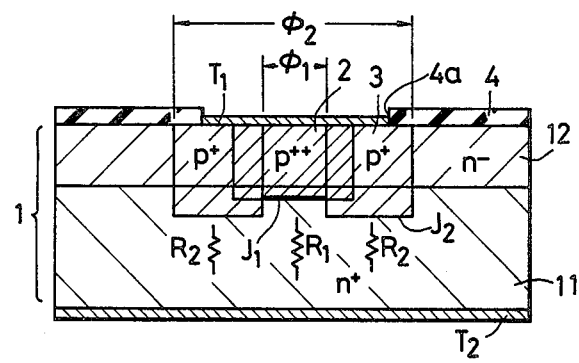

FIG. 7 shows another embodiment of a Zener diode according to this invention. In this embodiment, an $n^-$-type high resistance layer 12 is disposed on the front surface of an $n^+$-type silicon layer 11, and a first rectifying contact portion $J_1$ of a $p^{++}$-type central region 2 reaches the $n^+$-type layer of low resistance 11. A $p^+$-type diffused guard ring region 3 is formed so as to completely surround the $p^{++}$-type central region 2. A common first electrode $T_1$ is connected on the front surfaces of the $p^{++}$-type central region and the $p^+$-type guard ring region.

Figure 8:
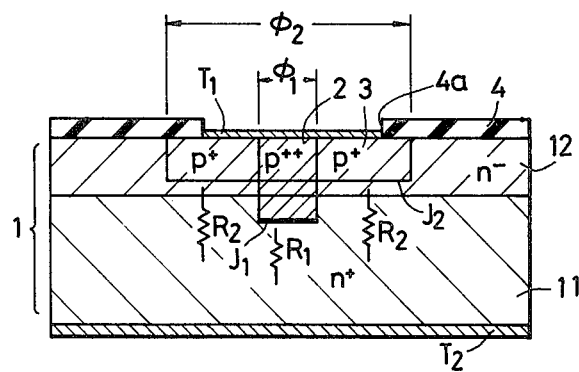

FIG. 8 shows still another embodiment of this invention. An $n^-$-type layer 12 (impurity density: $10^{14}$–$10^{16}$ atoms/cm$^3$) overlies an $n^+$-type layer 11. A first rectifying contact portion $J_1$ of a $p^{++}$-type central region 2 reaches the layer 11 of low resistance of $10^{15}$–$5\times10^{19}$ atoms/cm$^3$ in terms of the impurity density (which, however, varies depending upon a desired breakdown voltage $V_{Z1}$). A $p^+$-type diffused guard ring region 3 is formed in contact with the central region 2 and in a manner to completely enclose the central region 2, but a second rectifying contact portion $J_2$ thereof does not reach the $n^+$-type layer of the low resistance 11. In case of this embodiment, the p-type diffusion impurity densities of the $p^{++}$-type central region 2 and the $p^+$-type guard ring region 3 may be set to the same extent.

In any of the embodiments, the area of the first rectifying contact portion $J_1$ is made a very small value (approximately $1.256\times10^{-5}$ cm$^2$) in order to enhance the noise characteristic of the Zener diode. Also in any of the embodiments, the resistance value of the series resistance $R_1$ and the voltage value of the breakdown voltage $V_{Z2}$ of the second rectifying contact portion $J_2$ are determined so as to satisfy Equation (12) in order that the second rectifying contact portion $J_2$ may break down due to the voltage drop across the series resistance $R_1$ and the breakdown voltage $V_{Z1}$ of the first rectifying contact portion $J_1$ when the predetermined current $I_{Z(P3)}$ having a current density in the range which is greater than the current density of the maximum allowable value of D.C. currents corresponding to the maximum allowable D.C. power dissipation $P_{dmax}$ at the operating point $P_2$ of the Zener diode and which is smaller than the critical allowable current density $J_{crit}$ of non-D.C. currents at the operating point $P_4$ flows through the first rectifying contact portion $J_1$. Likewise, the breakdown voltage $V_{Z2}$ of the second rectifying contact portion $J_2$ is set at a voltage value which is greater than the terminal voltage $V_Z$ of the Zener diode at the operating point $P_2$ corresponding to the maximum allowable D.C. power dissipation $P_{dmax}$. Further, in order to make the maximum allowable instantaneous value $I_{F\ NON-DC(max)}$ of non-D.C. currents large, the resistance value of the series resistance $R_2$ associated with the second rectifying contact portion $J_2$ is made smaller than the resistance value of the series resistance $R_1$ associated with the first rectifying contact portion $J_1$. Accordingly, only the PN-junction of the first rectifying contact portion $J_1$ having the small area breaks down at the operating point ($P_1$-$P_2$) in the range of the power dissipations $P_d$ which is not greater than the maximum allowable D.C. power dissipation $P_{dmax}$ of the Zener diode, so that a low noise characteristic which is very excellent can be achieved.

Figure 9:
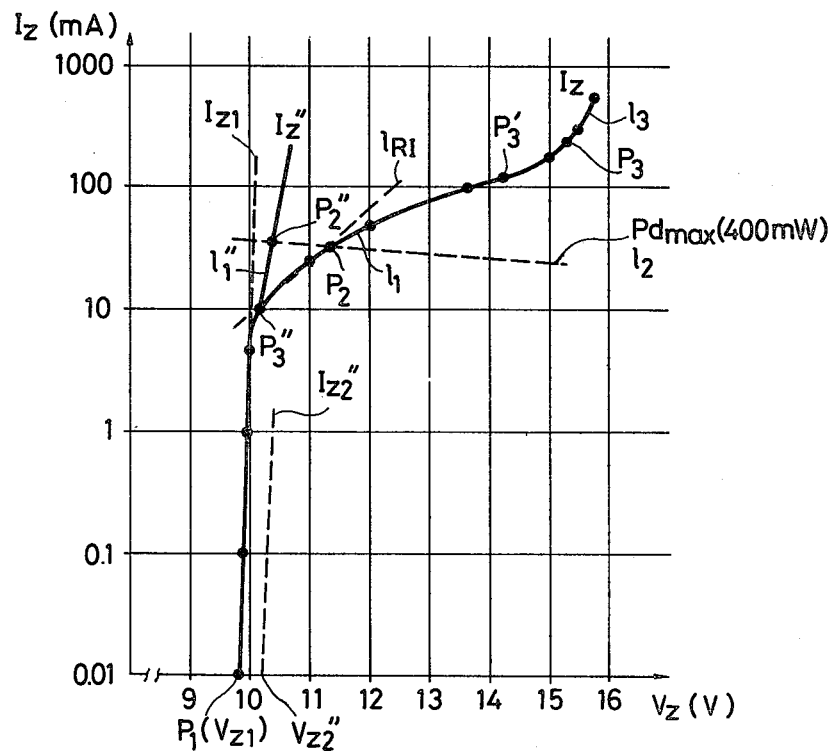
FIGS. 9 and 10 show terminal voltage ($V_Z$)—Zener current ($I_Z$) characteristics for explaining another modification, respectively.
Figure 10:
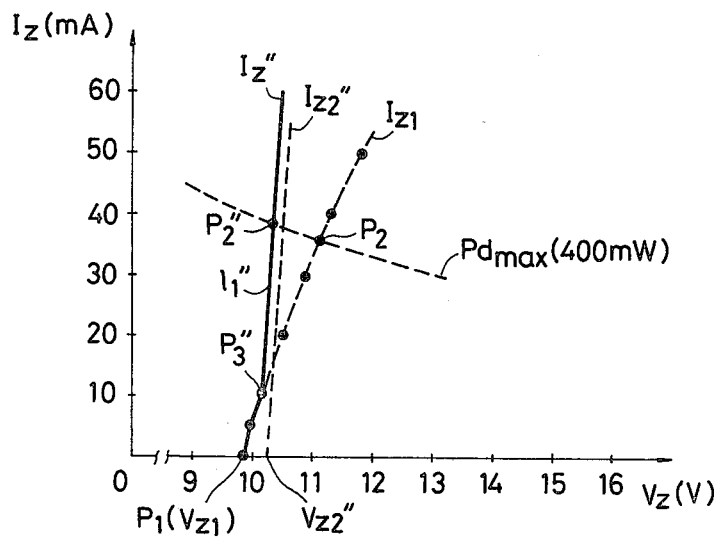

In the respective embodiments, however, the series resistance $R_1$ associated with the first rectifying contact portion $J_1$ has a resistance value which is not negligible in practice. Therefore, even at the operating point ($P_1$-$P_2$) in the range of the power dissipations $P_d$ which is not greater than the maximum allowable D.C. power dissipation $P_{dmax}$, the voltage drop across the series resistance $R_1$ becomes unnegligible when the Zener current $I_Z$ becomes great. FIG. 9 is a diagram in which the terminal voltage ($V_Z$)—Zener current ($I_Z$) characteristic of the Zener diode as shown in FIG. 5 is illustrated by a logarithmic graph with respect to the Zener current ($I_Z$). As seen from FIG. 9, in an operating region ($P_1$-$P_3''$) in which the Zener current $I_Z$ is comparatively small, the voltage drop across the series resistance $R_1$ is negligible as compared with the breakdown voltage $V_{Z1}$, and hence, the terminal voltage $V_Z$ becomes a voltage which is approximate to the value (9.8 V) of the breakdown voltage $V_{Z1}$ of the first rectifying contact portion $J_1$. In contrast, in an operating region ($P_3''$-$P_2$) in which the Zener current $I_Z$ is great, the voltage drop across the series resistance $R_1$ becomes unnegligible as indicated by a broken line $l_{RI}$, and the terminal voltage $V_Z$ increases more than the breakdown voltage $V_{Z1}$ of the first rectifying contact portion $J_1$. Such a great increase of the terminal voltage $V_Z$ beyond the breakdown voltage $V_{Z1}$ of the first rectifying contact portion $J_1$ in the range of the power dissipations $P_d$ not being greater than the maximum allowable D.C. power dissipation $P_{dmax}$ is an unfavorable characteristic from the viewpoint of the constant-voltage characteristic of the Zener diode as the voltage regulator device. In case where the Zener diode having the characteristic of FIG. 9 is employed in the voltage regulator circuit shown in FIG. 4, the resistance value of the resistor $R_{10}$ ought to be designed in conformity with Equation (10) so that the Zener current $I_Z$ may fall within the operating range ($P_1$-$P_3''$). According to a modified embodiment of this invention, the breakdown voltage $V_{Z2}''$ of the second rectifying contact portion $J_2$ is designed to a value of about 10.3 V as indicated in FIG. 9. Therefore, when the voltage $V_a$ of the power supply S increases greatly and thus departs from the operating region ($P_1$-$P_3''$), a current $I_2''$ begins to flow through the second rectifying contact portion $J_2$ as indicated in the figure. According to this modification, even when the operating region ($P_1$-$P_3''$) is departed from, the terminal voltage ($V_Z''$)—Zener current ($I_Z''$) characteristic of the Zener diode varies as indicated by a straight line $l_1''$ in the figure, so that a very excellent constant-voltage characteristic can be attained in an operating region ($P_1$-$P_2''$) at the power dissipations $P_d$ not being greater than the maximum allowable D.C. power dissipation $P_{dmax}$. FIG. 10 is a diagram in which the terminal voltage ($V_Z''$)—Zener current ($I_Z''$) characteristic of the modification having the extraordinarily excellent constant-voltage characteristic in this manner is illustrated by the ordinary scale, not by the logarithmic scale, with respect to the Zener current ($I_Z''$). Since the PN-junction of the second rectifying contact portion $J_2$ having the large junction area breaks down in the operating region ($P_3''$-$P_2''$) indicated by the straight line $l_1'''$, the noise characteristic in this operating region becomes inferior to those of the respective embodiments explained before.

This invention can adopt further various modified aspects of performance. For example, the first rectifying contact portion $J_1$ can be formed, not only by the PN-junction barrier, but also by a Schottky barrier of a metal-semiconductor system or by an alloy barrier. The first rectifying contact portion $J_1$ and the second rectifying contact portion $J_2$ need not be held in contact with each other within the semiconductor chip 1, but they may be spaced from each other.

According to the foregoing embodiments, the desired object can of course be accomplished, and the following effects can be brought forth:

(1) By forming the second rectifying contact portion $J_2$ which is larger in area than the first rectifying contact portion $J_1$, current is dispersed into the first rectifying contact portion $J_1$ and the second rectifying contact portion $J_2$ at the application of an excess reverse voltage, so that current crowding is prevented from occurring in the first rectifying contact portion $J_1$. The large electrode area is advantageous in point of promoting heat radiation from the whole surface of the electrode of the large area in case of, for example, the DHD (double heat-sink diode) structure.

Figure 11:
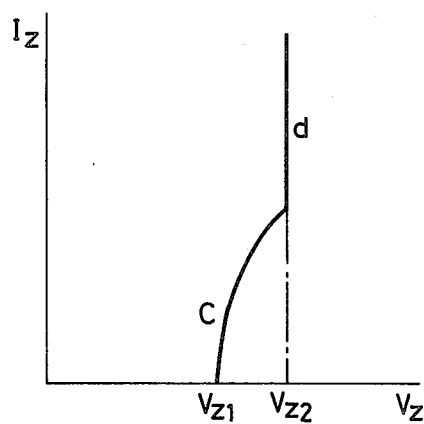
FIGS. 11 and 12 show terminal voltage ($V_Z$)—Zener current ($I_Z$) characteristics for explaining the principle of this invention, respectively.

(2) The breakdown voltage $V_{Z2}$ in the second rectifying contact portion $J_2$ is set to be high relative to the breakdown voltage $V_{Z1}$ in the first rectifying contact portion $J_1$. To this end, according to the present invention, the impurity density of the $p^{++}$-type central region 2 constituting the first rectifying contact portion $J_1$ is made slightly higher than that of the $p^+$-type guard ring region 3, or the guard ring region is made deeper than the central region (FIGS. 1, 6 or 7). Alternatively, the $p^{++}$-type central region 2 defining the first rectifying contact portion $J_1$ is caused to reach the $n^+$-type substrate 11, and the second rectifying contact portion $J_2$ of the guard ring region 3 is caused to reach the $n^+$-type high resistance layer 12, whereby the breakdown voltage $V_{Z2}$ of the second rectifying contact portion $J_2$ is made very slightly higher than the breakdown voltage $V_{Z1}$ of the first rectifying contact portion $J_1$. In such a Zener diode, as illustrated in FIG. 11, breakdown (C) in the first rectifying contact portion $J_1$ takes place at first, and a breakdown phenomenon (D) in the second rectifying contact portion $J_2$ takes place in the course of the abrupt rise of the breakdown (C). For example, in case where the breakdown voltage $V_{Z1}$ is made 7 V, it is desirable that the breakdown voltage $V_{Z2}$ is made about 9 V. Since such a breakdown characteristic is established, a high surge-bearing characteristic can be attained.

Figure 12:
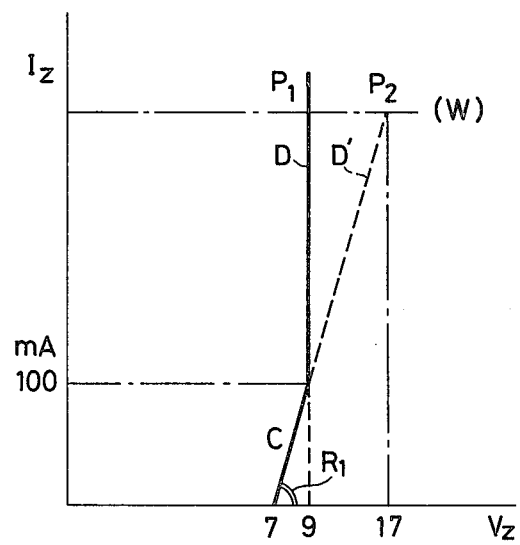

(3) By making the junction area of the first rectifying contact portion $J_1$ small as compared with that of the second rectifying contact portion $J_2$, for example, smaller than 1/10, the abrupt rise of the breakdown voltage is held, and simultaneously, noise can be diminished. Referring to FIG. 1 by way of example, when the diameter of the first rectifying contact portion $J_1$ is 40 $\mu$m and that of the second rectifying contact portion $J_2$ is 150 $\mu$m, the areal ratio between the first and second junction portions becomes 1:13. As to the case where the junction area of the second rectifying contact portion $J_2$ is made large in this manner, reference is had to FIG. 12. Supposing the breakdown voltages $V_{Z1}=7$ V and $V_{Z2}=9$ V as in the above condition under which the breakdown in the second rectifying contact portion $J_2$ starts after the breakdown has started in the first rectifying contact portion $J_1$, the series resistance $R_1$ of the first rectifying contact portion $J_1$ becomes about 20$\Omega$. Therefore, when a Zener current $I_Z$ greater than 100 mA has flowed, the second rectifying contact portion $J_2$ begins to break down. In FIG. 12, a broken line indicated at D' corresponds to a characteristic in the case where the second rectifying contact portion $J_2$ is not disposed, while a straight solid line indicated at D corresponds to a characteristic in the case where the second rectifying contact portion $J_2$ is disposed. If the breakdown takes place only in the first rectifying contact portion $J_1$, the power consumption P2 becomes 17 W. On the other hand, upon the breakdown of the second rectifying contact portion $J_2$, the power consumption P1 becomes 9 W advantageously. In this manner, the power consumption can be reduced owing to the breakdown of the second rectifying contact portion $J_2$, and it turns out that the surge endurance becomes high.

(4) Since the $p^+$-type guard ring region 3 forming the second rectifying contact portion $J_2$ surrounds completely the $p^{++}$-type central region 2 forming the first rectifying contact portion $J_1$ and is formed to be deeper than the latter (FIGS. 1, 6 or 7), electric field crowding in the edge part of the $p^{++}$-type central region 2 along the periphery thereof can be prevented, and a uniform electric field strength can be attained in the whole junction area of the first rectifying contact portion $J_1$. Accordingly, the voltage value of the breakdown voltage $V_{Z1}$ of the first rectifying contact portion $J_1$ as is exploited for the Zener voltage can be raised at high precision by the p-type impurity density of the $p^{++}$-type central region 2 and the n-type impurity density of the $n^+$-type layer 11.

The Zener diode according to this invention can be utilized, not only for the voltage regulator circuit, but also for an amplitude limiter circuit.

What is claimed is:

1. A semiconductor device comprising:
a semiconductor substrate of a first conductivity type having opposite first and second major surfaces;
a highly doped semiconductor region of a second conductivity type opposite to said first conductivity type formed in said semiconductor substrate, and extending into said semiconductor substrate from said first major surface, said highly doped semiconductor region having a bottom portion which forms a first PN junction with said semiconductor substrate, said first PN junction having a breakdown voltage;
a lightly doped semiconductor region of the second conductivity type formed in said semiconductor substrate, adjoining and surrounding said highly doped semiconductor region, and extending into said semiconductor substrate from said first major surface, said lightly doped semiconductor region having a bottom portion which forms a second PN junction with said semiconductor substrate;
a first electrode formed on said first major surface and contacting said highly and lightly doped semiconductor regions; and
a second electrode formed on said second major surface and contacting said semiconductor substrate, wherein a total first spreading resistance of said semiconductor substrate between the entire bottom portion of the highly doped semiconductor region and said second electrode is greater than a total second spreading resistance of said semiconductor substrate between the entire bottom portion of the lightly doped semiconductor region and said second electrode, and wherein the breakdown voltage of said second PN junction is selected to be a voltage higher than the breakdown voltage of said first PN junction, but lower than a total voltage of said breakdown voltage of the first PN junction plus a voltage drop across said first spreading resistance caused by a maximum allowable current through said PN junction above which a current value causes the permanent destruction of said first PN junction.

2. A semiconductor device according to claim 1, wherein the bottom portion of said highly doped semiconductor region has an area smaller than that of the bottom portion of said lightly doped semiconductor region.

3. A semiconductor device according to claim 2, wherein the bottom portion of said highly doped semiconductor region has a depth from said first major surface smaller than that of said bottom portion of said lightly doped semiconductor region.

4. A semiconductor device comprising:
a semiconductor substrate of a first conductivity type having opposite first and second major surfaces;
a highly doped semiconductor region of a second conductivity type opposite to said first conductiivty type formed in said semiconductor substrate, and extending into said semiconductor substrate from said first major surface, said highly doped semiconductor region having a bottom portion which forms a first PN junction with said semiconductor substrate, said first PN junction having a breakdown voltage;
a lightly doped semiconductor region of the second conductivity type formed in said semiconductor substrate, adjoining and surrounding said highly doped semiconductor region, and extending into said semiconductor substrate from said first major surface, said lightly doped semiconductor region having a bottom portion which forms a second PN junction with said semiconductor substrate, said second PN junction having a breakdown voltage higher than that of said first PN junction;
a first electrode formed on said first major surface and contacting said highly and lightly doped semiconductor regions; and
a second electrode formed on said second major surface and contacting said semiconductor substrate, wherein a total first spreading resistance of said semiconductor substrate between the entire bottom portion of the highly doped semiconductor region and said second electrode is greater than a total second spreading resistance of said semiconductor substrate between the entire bottom portion of the lightly doped semiconductor region and said second electrode, wherein the bottom portion of said highly doped semiconductor region has an area smaller than that of the bottom portion of said lightly doped semiconductor region, and wherein the bottom portion of said highly doped semiconductor region has a depth from said first major surface larger than that of said bottom portion of said lightly doped semiconductor region.

5. A semiconductor device comprising:
a semiconductor substrate of a first conductivity type having opposite first and second major surfaces;
a highly doped semiconductor region of a second conductivity type opposite to said first conductivity type formed in said semiconductor substrate, and extending into said semiconductor substrate from said first major surface, said highly doped semiconductor region having a bottom portion which forms a first PN junction with said semiconductor substrate, said first PN junction having a breakdown voltage;
a lightly doped semiconductor region of the second conductivity type formed in said semiconductor substrate, adjoining and surrounding said highly doped semiconductor region, and extending into said semiconductor substrate from said first major surface, said lightly doped semiconductor region having a bottom portion which forms a second PN junction with said semiconductor substrate, said second PN junction having a breakdown voltage higher than that of said first PN junction;
a first electrode formed on said first major surface and contacting said highly and lightly doped semiconductor regions; and
a second electrode formed on said second major surface and contacting said semiconductor substrate, wherein a total first spreading resistance of said semiconductor substrate between the entire bottom portion of the highly doped semiconductor region and said second electrode is greater than a total second spreading resistance of said semiconductor substrate between the entire bottom portion of the lightly doped semiconductor region and said second electrode, wherein the bottom portion of said highly doped semiconductor region has a depth from said first major surface smaller than that of said bottom portion of said lightly doped semiconductor region, wherein said semiconductor substrate comprises a first semiconductor layer having a low impurity concentration and a second semiconductor layer formed on said first semiconductor layer and having a high impurity concentration, and wherein said highly and lightly doped semiconductor regions are formed in said second semiconductor layer, said first semiconductor layer serving to enhance the first and second spreading resistances generated in said second semiconductor layer adjacent to the junction of said second semiconductor layer with said highly and lightly doped semiconductor regions.

6. A Zener diode comprising:
a semiconductor substrate of one conductivity type having opposite first and second major surfaces;
a highly doped cylindrical semiconductor region extending to a first predetermined depth into said semiconductor substrate from said first major surface;
a lightly doped annular semiconductor region extending to a second predetermined depth deeper than said first predetermined depth into said semiconductor substrate from said first major surface, and being adjacent to said cylindrical semiconductor region, said annular semiconductor region exposing a portion of a bottom surface of said cylindrical semiconductor region of said semiconductor substrate so as to form a first PN junction between the exposed bottom surface portion of said cylindrical semiconductor region and said semiconductor substrate, said annular semiconductor region having a bottom surface which forms a second PN junction with said semiconductor substrate;
a first electrode commonly contacting said first major surface of said cylindrical and annular semiconductor regions; and a second electrode contacting said second major surface and being opposite to said first and second PN junctions, wherein said first PN junction has a total area smaller than that of said second PN junction, wherein a total first spreading resistance of said semiconductor substrate between said entire first PN junction and said second electrode has a value higher than a total second spreading resistance of said semiconductor substrate between said entire second PN junction and said second electrode, and wherein the avalanche breakdown voltage of said second PN junction is selected to be a voltage higher than the avalanche breakdown voltage of said first PN junction, but lower than a total voltage of said avalanche breakdown voltage of the first PN junction plus a voltage drop across said first spreading resistance caused by a maximum allowable current through said first PN junction above which a current value causes the permanent destruction of said first PN junction.

* * * * *